US006718825B1

(12) United States Patent
Platt et al.

(10) Patent No.: US 6,718,825 B1

(45) Date of Patent: Apr. 13, 2004

(54) METHODS AND SYSTEMS FOR REDUCING STICK-DOWN WITHIN MEMS STRUCTURES

(75) Inventors: William P. Platt, Columbia Heights, MN (US); William A. Harris, Coon Rapids, MN (US); Neil G. W. Hedtke, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/346,335

(22) Filed: Jan. 17, 2003

(51) Int. Cl.[7] .............................................. G01P 15/125

(52) U.S. Cl. ................... 73/514.32; 73/1.82; 73/504.02

(58) Field of Search ......................... 73/504.02, 504.03, 73/504.04, 504.12, 504.14, 514.29, 514.32, 1.38, 1.75, 1.77, 1.82

(56) References Cited

U.S. PATENT DOCUMENTS 5,025,346 A 6/1991 Tang et al.
5,349,855 A 9/1994 Bernstein et al.
5,392,650 A 2/1995 O'Brien et al.
5,458,000 A 10/1995 Burns et al.
5,496,436 A 3/1996 Bernstein et al.
5,530,342 A 6/1996 Murphy
5,581,035 A 12/1996 Greiff
5,600,064 A 2/1997 Ward
5,604,309 A 2/1997 Ward
5,608,351 A 3/1997 Ward
5,646,348 A 7/1997 Greiff et al.
5,672,949 A 9/1997 Ward
5,703,292 A 12/1997 Ward
5,892,153 A 4/1999 Weinberg et al.
5,952,574 A 9/1999 Weinberg et al.
6,040,625 A 3/2000 Ip
6,230,566 B1 5/2001 Lee et al.
6,257,059 B1 7/2001 Weinberg et al.
6,311,556 B1 11/2001 Lefort et al.
6,350,983 B1 2/2002 Kaldor et al.
6,426,538 B1 7/2002 Knowles
6,481,285 B1 11/2002 Shkel et al.
2001/0042404 A1 11/2001 Yazdi et al.
2002/0066317 A1 6/2002 Lin
2002/0093067 A1 7/2002 Knowles
2002/0167248 A1 11/2002 Chua et al.
2002/0178817 A1 12/2002 Selvakumar et al.
2002/0184949 A1 12/2002 Gianchandani et al.

*Primary Examiner*—Richard A. Moller
(74) *Attorney, Agent, or Firm*—Matthew Luxton, Esq.; Armstrong Teasdale LLP

(57) ABSTRACT

A method for reduces the sticking of proof masses in micro-electromechanical systems (MEMS) devices to sense plates in the MEMS device due to acceleration forces to which the MEMS device is subjected. The method includes determining a beginning of acceleration events which would cause proof masses to contact sense plates, reducing sense bias voltages to the sense plates, determining an end of the acceleration event, and increasing sense bias voltages to their former levels.

17 Claims, 4 Drawing Sheets

MOTOR DRIVE SIGNAL
52
54
-1
46
44
42
46
10
$V_{BIAS}$ 60
INPUTS FROM ACCELERATION SENSORS
78
IMU
76
72
I P
MEMORY
74
70
SENSE BIAS VOLTAGE
56
$-V_{BIAS}$
62
18
19
14
15
16
17
20
21
40
48
50
58
100
DETERMINE HIGH ACCELERATION EVENT
102
REDUCE BIAS VOLTAGE AT SENSE PLATES, BASED ON AN AMOUNT OF ACCELERATION
104
DETERMINE END OF HIGH ACCELERATION EVENT
106
INCREASE BIAS VOLTAGE AT SENSE PLATES TO FORMER LEVELS
108

METHODS AND SYSTEMS FOR REDUCING STICK-DOWN WITHIN MEMS STRUCTURES

BACKGROUND OF THE INVENTION

This invention relates generally to micro-electromechanical systems (MEMS), and more specifically, to avoidance of stick-down within MEMS devices due to forces generated during operation of the MEMS devices.

Micro-electromechanical systems (MEMS) integrate electrical and mechanical components on the same substrate, for example, a silicon substrate, using microfabrication technologies. The electrical components are fabricated using integrated circuit processes, while the mechanical components are fabricated using micromachining processes that are compatible with the integrated circuit processes. This combination makes it possible to fabricate an entire system on a chip using standard manufacturing processes.

One common application of MEMS devices is in the design and manufacture of sensor devices. The mechanical portion of the sensor device provides the sensing capability, while the electrical portion of the sensor device processes the information received from the mechanical portion. One example of a MEMS device is a gyroscope. Some inertial measurement units (IMUs) incorporate one or more MEMS gyroscopes MEMS gyroscopes.

One known type of MEMS gyroscope uses vibrating elements to sense angular rate through the detection of a Coriolis acceleration. The vibrating elements are put into oscillatory motion in a drive plane, which is parallel to the substrate. Once the vibrating elements are put in motion, the gyroscope is capable of detecting angular rates induced by the substrate being rotated about an input axis. Coriolis acceleration occurs in a sense plane, which is perpendicular to both the drive plane and the input plane. The Coriolis acceleration produces a Coriolis motion having an amplitude proportional to the angular rate of the substrate.

However, due to external acceleration forces and electrostatic forces within the MEMS device, the vibrating elements sometimes become stuck to sense plates which are mounted on the substrate, affecting operation of the MEMS device. Such phenomena are sometimes referred to as "stick-down".

BRIEF SUMMARY OF THE INVENTION

In one aspect, a method for reducing the sticking of proof masses to sense plates in micro-electromechanical systems (MEMS) devices is provided. The method comprises determining a beginning of acceleration events, which may cause proof masses to contact sense plates, reducing sense bias voltages to the sense plates during the event, determining an end of the acceleration event, and increasing sense bias voltages to the pre-reduced levels.

In another aspect, a micro-electromechanical systems (MEMS) device is provided which comprises a substrate, and a plurality of sense plates, a plurality of motor drive combs, and a plurality of motor pickoff combs, all attached to the substrate. The MEMS device further comprises a plurality of proof masses each suspended above one of the sense plates and between one of the motor drive combs and one of the motor pickoff combs, and a control circuit configured to control a sense bias voltage applied to the sense plates based upon acceleration forces applied to the MEMS device.

In still another aspect, a control circuit for reducing stick-down within a micro-electromechanical systems (MEMS) device is provided. The control circuit comprises a processor configured to control sense bias voltages applied to the sense plates based upon acceleration forces applied to the MEMS device.

In yet another aspect, a method for suppressing stick-down of proof masses to sense plates in micro-electromechanical systems (MEMS) devices is provided. The method comprises adjusting a sense bias voltage applied to the sense plates based upon acceleration forces applied the MEMS device.

In a further aspect, a micro-electromechanical systems (MEMS) gyroscope is provided which comprises a substrate, and a plurality of sense plates, a plurality of motor drive combs, and a plurality of motor pickoff combs all attached to the substrate. The gyroscope also comprises a plurality of proof masses each suspended above one of the sense plates and between one of the motor drive combs and one of the motor pickoff combs. The gyroscope also comprises a control circuit configured to reduce or eliminate stick-down between the proof masses and the sense plates. The circuit is configured to adjust a sense bias voltage applied to the sense plates based upon an amount of acceleration applied to the MEMS device.

DETAILED DESCRIPTION OF THE INVENTION

Figure 1:
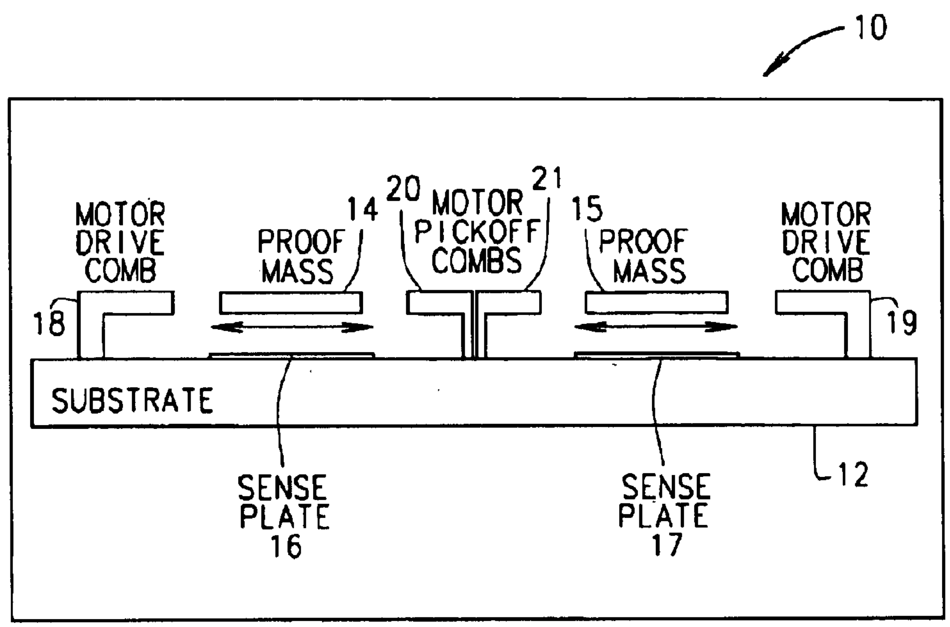
FIG. 1 is an illustration of a MEMS device during normal operation.

FIG. 1 illustrates a side plan view of a known exemplary micro-electromechanical system (MEMS) device 10, specifically a MEMS gyroscope. MEMS device 10 is formed on a substrate 12 and includes at least one proof mass 14, 15 suspended above a respective sense plate 16, 17 by a plurality of suspensions (shown in FIG. 3). Proof masses 14, 15 are fabricated from any mass suitable for use in a MEMS device. In one embodiment, proof mass 14 is a plate of silicon. Other materials compatible with micro-machining techniques may also be utilized. While FIG. 1 shows two proof masses 14, 15, MEMS devices utilizing less than or greater than two proof masses 14, 15 may also be utilized.

MEMS device 10 also includes motor drive combs 18, 19 and motor pickoff combs 20, 21 which correspond to respective proof masses 14, 15. As shown, proof mass 14 is suspended substantially between motor drive comb 18 and motor pickoff comb 20, and proof mass 15 is suspended substantially between motor drive comb 19 and motor pickoff comb 21. Although not shown in FIG. 1, proof masses 14, 15 are caused to oscillate between their respective motor drive comb 18, 19 and motor pickoff comb 20, 21 due to a motor drive signal applied to motor drive combs 18, 19. A bias voltage is applied to sense plates 16, 17 and a changing position of proof masses 14, 15 is detected, as the movement causes a change in capacitance between proof mass 14 and sense plate 16 and between proof mass 15 and sense plate 17.

Figure 2:
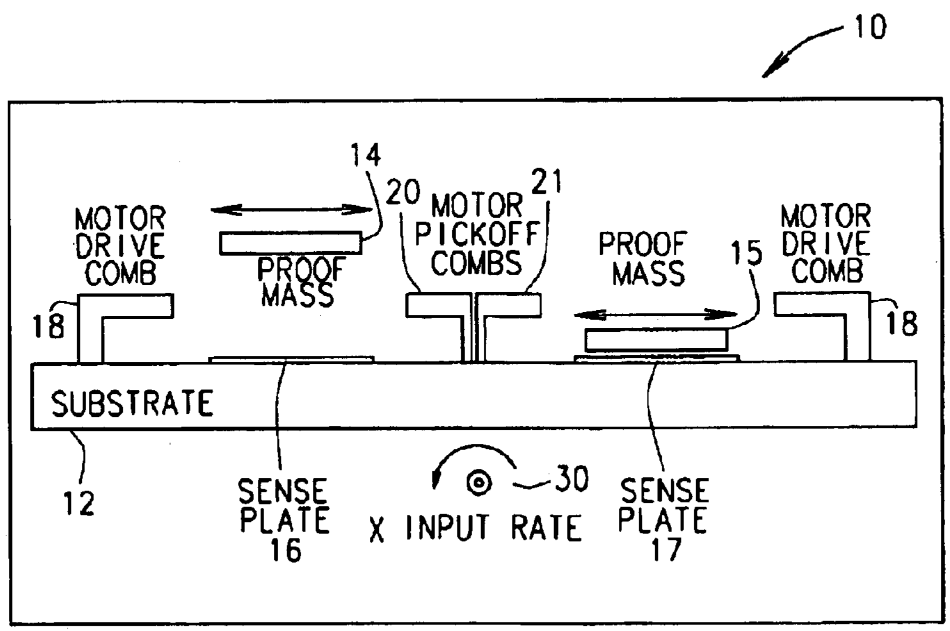
FIG. 2 is an illustration of a MEMS device exhibiting stick-down of a proof mass.

FIG. 2 illustrates a side plan view of MEMS device 10 (also shown in FIG. 1) while it is subjected to a large rotational acceleration, as shown by input rate arrow 30. As proof masses 14, 15 are suspended with flexible suspensions (shown in FIG. 3), an excessive linear acceleration force causes proof mass 15 to contact sense plate 17. In one embodiment, sense plates 16, 17 are at a potential of an applied bias voltage, and proof masses 14, 15 are at a neutral potential. As proof mass 15 approaches or makes physical contact with sense plate 17, electrostatic force caused by the difference in potential causes proof mass 15 to stick to sense plate 17. This condition is generally referred to as "stick-down", and as described above, is contact between a proof mass and a sense plate in the MEMS device caused by at least one of acceleration forces applied to the MEMS device and a voltage difference between the proof mass and the sense plate. As proof mass 15 is stuck to its sense plate 17, it cannot oscillate properly and operation of device 10 is adversely affected.

Figure 3:
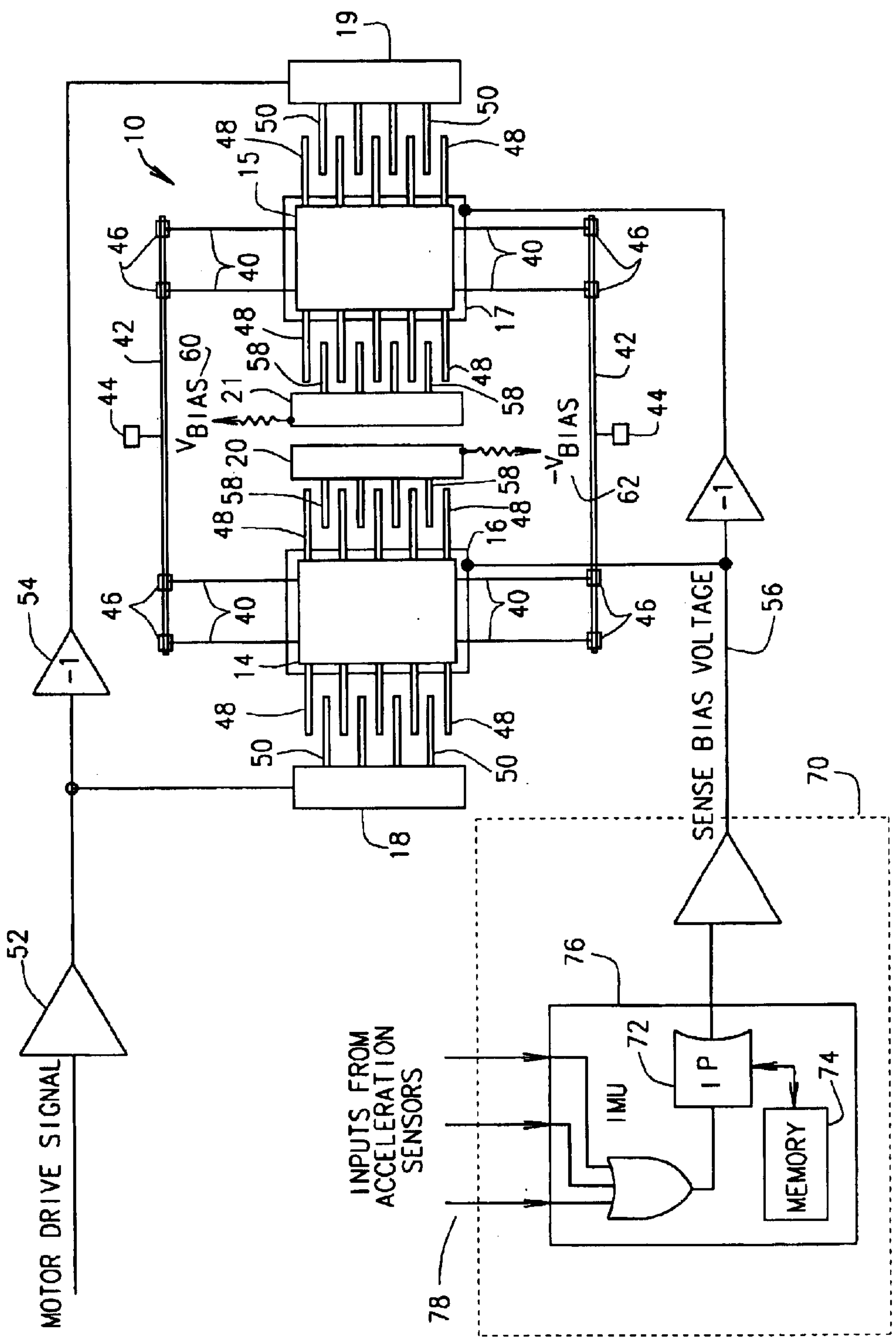
FIG. 3 is an illustration of a micro-electromechanical system (MEMS) device which utilizes control circuitry to avoid stick-down of proof masses.

FIG. 3 is a top plan view of MEMS device 10, and circuitry which reduces or eliminates stick-down of proof masses 14, 15. Device 10 includes substrate 12 (shown in FIGS. 1 and 2), sense plates 16, 17, and proof masses 14, 15. In the embodiment shown, device 10 further includes suspensions 40 for supporting proof masses 14, 15, and at least one cross beam 42 connected to suspensions 40. Crossbeam 42 is affixed to substrate 12 at anchor 44, which also provides support of crossbeams 42. In an alternative configuration, suspensions 40 are individually and directly connected to substrate 12 at anchor points 46, and crossbeam 16 is not utilized. In one embodiment, anchors 44 are formed as part of substrate 12. While two anchors 44 are depicted in FIG. 3, any number of anchors 44 can be utilized. Anchors 44 are positioned along a respective cross beam 42 in any manner that provides support for proof masses 14, 15. While four suspensions 40 are depicted in FIG. 3 for suspending each of proof masses 14, 15, any number of suspensions 40 which provide adequate support for proof masses 14, 15 may be utilized. Suspensions 40 are, in one embodiment, beams micro-machined from a silicon wafer. Suspensions 40 also act as springs allowing proof masses 14, 15 to move within a drive plane (X-axis) and a sense plane (Y-axis).

Proof mass 14 is located substantially between motor drive comb 18 and motor pickoff comb 20. Proof mass 15 is located substantially between motor drive comb 19 and motor pickoff comb 21. As known in the art, proof masses 14, 15 include a plurality of comb-like electrodes 48. A portion of electrodes 48 extend towards motor drive combs 18, 19 and a portion of electrodes 48 extend towards motor pickoff combs 20, 21. While, in the illustrated embodiment, proof masses 14, 15 have ten electrodes 48, it is known to utilize proof masses incorporating different numbers of electrodes.

Motor drive comb 18 includes a plurality of comb-like electrodes 50 extending towards proof mass 14. Motor drive comb 19 includes a plurality of comb-like electrodes 50 extending towards proof mass 15. While motor drive combs 18, 19 are shown as having four electrodes 50, the number of electrodes 50 on motor drive combs 18, 19 typically is determined by the number of electrodes 48 on their respective proof mass 14, 15. Motor drive combs 18, 19 are typically connected to a motor drive circuit 52. Motor drive comb 18 and motor drive comb 19 are driven at potentials that are opposite from one another, in one embodiment through use of an inverter circuit 54. Electrodes 48 and electrodes 50 are interdigitated as they extend from proof mass 14 and motor drive comb 18, and from proof mass 15 and motor drive comb 19, and form capacitors.

Motor drive circuit 52 applying signals to motor drive combs 18, 19 causes respective proof masses 14, 15 to oscillate at substantially a tuning fork frequency along the drive plane (X-axis) by using the capacitors formed by the plurality of interdigitated comb-like electrodes 48, 50 of proof mass 14 and motor drive comb 18 and of proof mass 15 and motor drive comb 19. MEMS device 10 has two closely spaced modes of oscillation. One of the modes, sometimes referred to as a motor mode, is driven by an electrostatic force, at a resonant frequency of device 10 to produce a relatively large amplitude of oscillation. When a rotational force is applied to device 10, a Coriolis force is generated which is proportional to the velocity of proof masses 14, 15 in the motor mode. The Coriolis force drives a second mode of oscillation of device 10, sometimes referred to as a sense mode. One or more electrodes are provided to detect oscillations in the sense mode, as described below, utilizing capacitance. A DC and/or an AC sense bias voltage 56 is applied to sense plates 16, 17, which are sometimes referred to as sense electrodes, so that a motion of proof masses 14, 15 in the sense mode produces an output current.

Motor pickoff comb 20 includes a plurality of comb-like electrodes 58 extending toward proof mass 14 and motor pickoff comb 21 includes a plurality of comb-like electrodes 58 extending toward proof mass 15. While motor pickoff combs 20, 21 are depicted as having four electrodes 58, the number of electrodes 58 extending from motor pickoff combs 20, 21 is typically determined by the number of electrodes 48 on proof masses 14, 15. Motor pickoff combs 20, 21 are sometimes referred to as sense combs. Electrodes 48 and electrodes 58 are interdigitated as they extend from proof masses 14, 15 and motor pickoff combs 20, 21 and form capacitors. The capacitors allow MEMS device 10 to sense motion in the drive plane (X-axis). As shown in FIG. 3, motor pickoff combs 20, 21 are typically connected to a DC bias voltage, for example, comb 21 connected to a positive bias voltage source 60, and comb 20 connected to a negative bias voltage source 62. Voltage source 62 supplies substantially the same voltage as source 60, but at an opposite polarity.

Sense plate 16 is parallel to proof mass 14 and forms a capacitor. Sense plate 17 is parallel to proof mass 15 and forms a capacitor. If an angular rate (i.e. an aircraft turning) is applied to MEMS gyroscope 10 along an input plane (Z-axis) while proof masses 14, 15 are oscillating along the drive plane (X-axis), a Coriolis force is detected in the sense plane (Y-axis). The capacitance is used to sense motion in the sense plane (Y-axis). An output of MEMS gyroscope 10 typically is a signal proportional to the change in capacitance caused by the motion. Sense plates 16, 17 are typically connected to sense electronics, not shown in FIG. 1. Sense electronics detect changes in capacitance as proof masses 14, 15 move toward and/or away from their respective sense plates 16, 17 and the respective motor drive combs 18, 19 and motor pickoff combs 20, 21.

In one embodiment, proof mass 14 and proof mass 15 oscillate mechanically out-of-phase with one another and such oscillation is generally referred to as a differential mode of oscillation. For example, as proof mass 14 moves towards motor drive comb 18, proof mass 15 moves in an opposite direction towards motor drive comb 19. However, since suspensions 40 acts as springs for proof masses 14, 15, other movements of proof masses 14 and 15 can exist. Specifically, while operating during high acceleration events, movements of proof masses 14, 15 of MEMS device 10 can exceed operational limits and therefore become stuck to sense bias plates 16, 17 resulting in the above described stick-down of proof masses.

Proof mass 14 is electrically attracted to biased sense plate 16 and proof mass 15 is electrically attracted to biased sense plates 17. When the displacement of one or more of proof masses 14, 15 exceeds a limit, for example, through acceleration of MEMS device 10, proof mass 14 can contact biased sense plate 16, or proof mass 15 can contact biased sense plates 17 and become "stuck down", due to the difference in potential between sense plates 16, 17 and proof masses 14, 15. FIG. 3 further illustrates a control circuit 70 for reducing or eliminating stick-down. Circuit 70 operates by reducing sense bias voltages 60, 62 on sense plates 16 in anticipation of and during high acceleration events to which MEMS device 10 is subjected. By reducing sense bias voltages 60 and 62, potential differences between proof mass 14 and sense plate 16 and proof mass 15 and sense plate 17 are reduced to a level which also reduces a propensity for stick-down.

However, changing sense bias voltages 60, 62 does not alter the normal mode of motor axis motion. Since sense bias voltages 60, 62 can be changed quickly by an event driven process, through control circuit 70, stick-down is reduced while MEMS device 10 continues to operate properly. Control circuit 70 also allows MEMS device 10 to quickly resume the previous operating condition (i.e. return sense bias voltages to former levels) after a high acceleration event.

In one embodiment, control circuit 70 includes a mission processor 72 and associated memory 74 of an Inertial Measurement Unit (IMU) 76. Mission processor 72 is programmed to command a change in sense bias voltages 60, 62 to a safe level prior to a high acceleration event, for example, high acceleration shock caused by steering mechanisms in a missile. After the high acceleration shock is completed, mission processor 72 is programmed to command a change in sense bias voltages 60, 62 back to normal operating levels. In the embodiment shown, control circuit 70 controls sense bias voltages through two methods. In the first, memory 74 for mission processor 72 is pre-programmed with acceleration events that will occur, for example, in the course of a programmed flight plan, and mission processor 72 causes sense bias voltages 60, 62 to be adjusted in accordance with the flight plan. In the second, control circuit 70, through mission processor 72 monitors inputs 78 from acceleration sensors (not shown), and when high acceleration amounts are detected, mission processor 72 reduces sense bias voltages 60, 62 to a level that avoids stick-down of proof masses 14, 15.

Figure 4:
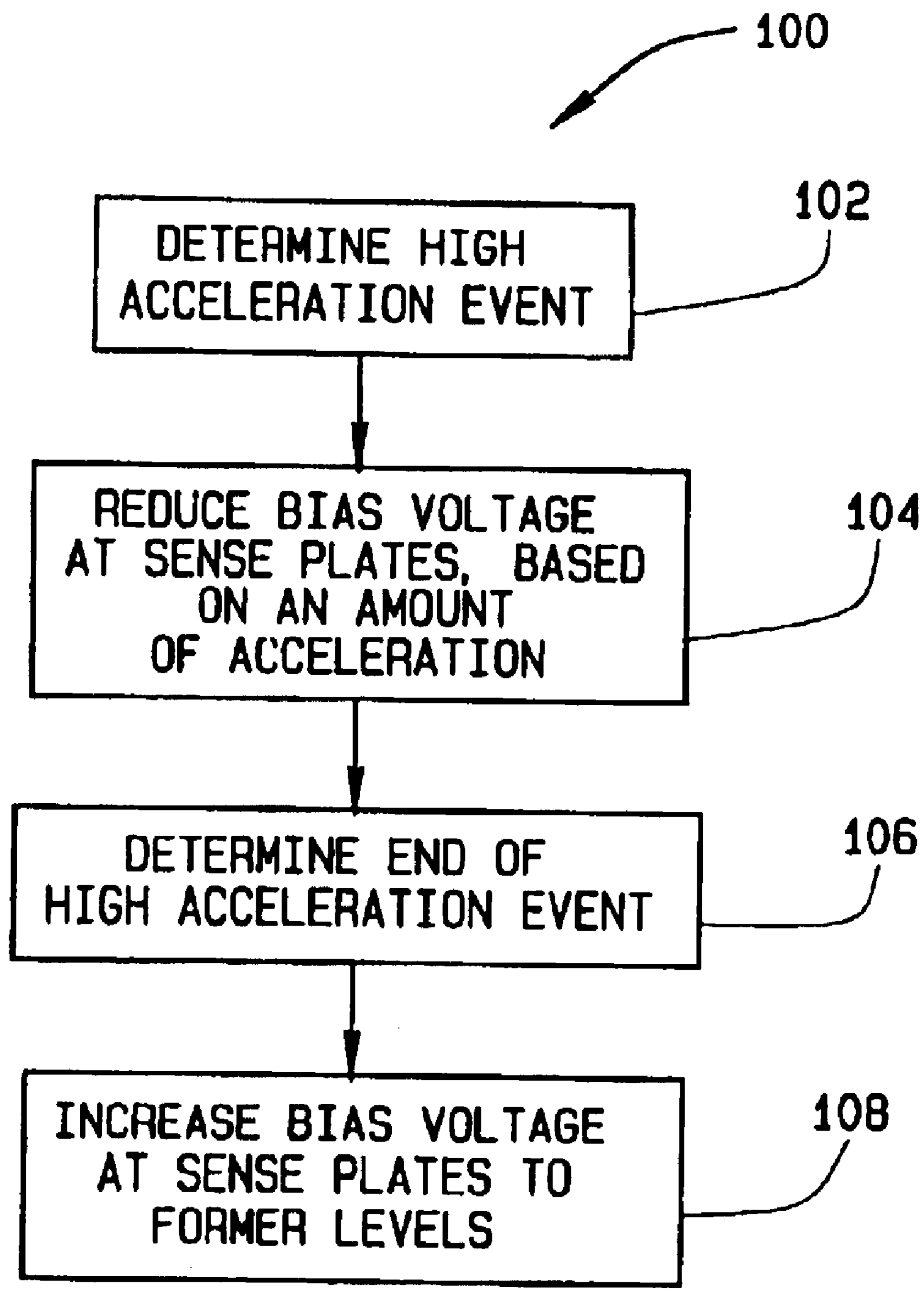
FIG. 4 is a flowchart illustrating a stick-down reduction method utilizing the MEMS device of FIG. 3.

FIG. 4 is a flowchart 100 which illustrates at least one embodiment of the methods performed by control circuit 70 (shown in FIG. 3). First, high acceleration events are determined 102, either through pre-programming or through acceleration sensor inputs 78 (shown in FIG. 3) as described above. Next, sense bias voltages 60, 62 (shown in FIG. 3) are reduced 104, based on an amount of acceleration sensed or pre-programmed. An end to the high acceleration event is determined 106, again, either through sensors or pre-programming, and sense bias voltage 60, 62 are increased 108 to their former levels.

Figure 5:
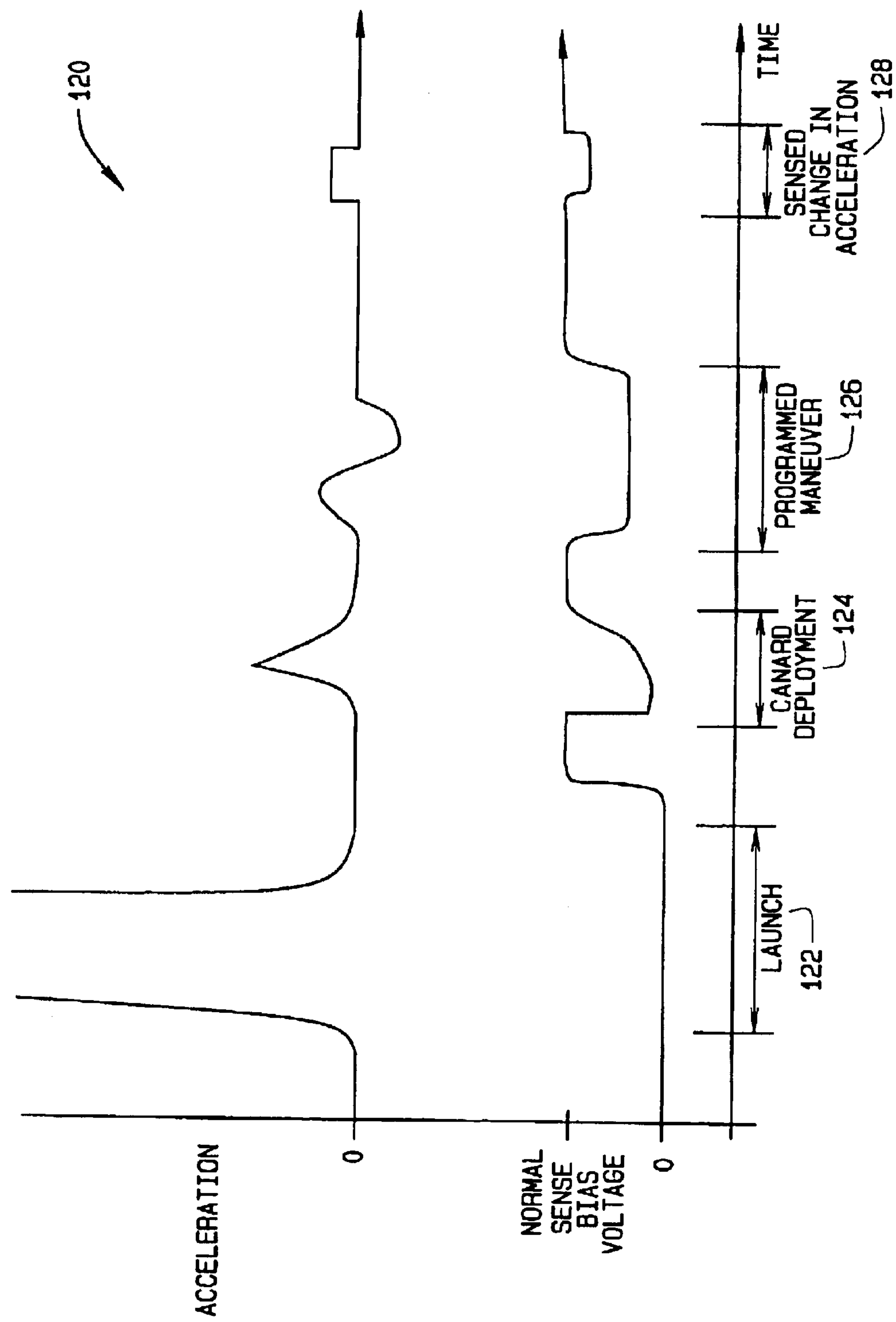
FIG. 5 is a chart illustrating acceleration over time for a MEMS device and a sense bias voltage over time for the MEMS device as controlled utilizing the circuitry of FIG. 3.

FIG. 5 is a graph 120 of acceleration over time as it affects sense bias voltages 60, 62 (shown in FIG. 3), specifically a missile flight path, both pre-programmed flight and unexpected accelerations experienced during flight. At launch 122, acceleration forces are extreme, and sense bias voltages are held at or near zero. As the launch is completed acceleration forces return to near zero, and the sense bias voltages are increased to their normal operating levels. A high acceleration event 124, for example, steering mechanism engagement, and programmed maneuvers 126 cause acceleration forces to increase, and sense bias voltages are reduced accordingly through control circuit 70, based upon an amount, and timing, of the acceleration forces. A sensed change in acceleration 128, although shown as small compared to other acceleration forces, nonetheless causes control circuit 70 to provide an appropriate change to the sense bias voltages.

Operation of MEMS device 10 is at least partially based upon sense bias voltages applied to sense bias plates 16, 17 (shown in FIGS. 1, 2, and 3) and proper operation (movement) of proof masses 14, 15. As described above, acceleration forces experienced by a MEMS device 10, electrical potential differences between proof mass 14 and sense bias plate 16, and electrical potential differences between proof mass 15 and sense bias plate 17, can combine to cause proof masses to become stuck-down to sense bias plates. Utilization of control circuit 70 provides compensation to sense bias voltages 60, 62, which allow proof masses 14, 15 to move during periods of acceleration, but not remain stuck-down to sense bias plates 16, 17 after the acceleration forces have dissipated.

The above described embodiments are utilized to compensate operational characteristics of MEMS devices. While FIGS. 1, 2, and 3 illustrate MEMS device 10 as an in-plane tuning fork gyroscope, other MEMS vibratory devices that use Coriolis acceleration to detect rotation, such as an angular rate sensing gyroscope, may benefit from the use of the circuits herein described. In addition, such circuitry can be incorporated into other MEMS devices, including, but not limited to, accelerometers, inertial measurement units, resonators, pressure sensors, and temperature sensors. While the invention has been described in terms of various specific embodiments, those skilled in the art will recognize that the invention can be practiced with modification within the spirit and scope of the claims.

What is claimed is:

1. A method for reducing the sticking proof masses to sense plates in micro-electromechanical systems (MEMS) devices, said method comprising:

determining a beginning of acceleration events which may cause proof masses to contact sense plates;

reducing sense bias voltages to the sense plates;

determining an end of the acceleration event; and increasing sense bias voltages to their pre-reduced levels.

2. A method according to claim 1 wherein determining beginnings and ends of acceleration events comprises at least one of pre-programming acceleration events and sensing acceleration forces with sensors.

3. A method according to claim 2 wherein pre-programming acceleration events comprises storing acceleration events in a memory to be accessed by a processor.

4. A method according to claim 1 wherein reducing and increasing sense bias voltages comprises controlling sense bias voltages with a programmed processor.

5. A method according to claim 4 wherein controlling sense bias voltages comprises controlling sense bias voltages based on an amount of acceleration.

6. A micro-electromechanical systems (MEMS) device comprising:

a substrate;

a plurality of sense plates attached to said substrate;

a plurality of motor drive combs attached to said substrate;

a plurality of motor pickoff combs attached to said substrate;

a plurality of proof masses, each said proof mass suspended above a respective one of said sense plates and between a respective one of said motor drive combs and a respective one of said motor pickoff combs; and a control circuit configured to control a sense bias voltage applied to said sense plates based upon acceleration forces applied to said MEMS device.

7. A MEMS device according to claim 6 wherein said circuit comprises:

at least one acceleration sensor input;

a processor configured to adjust the sense bias voltage based upon said at least one acceleration sensor input and pre-programmed acceleration events; and a memory configured to store the pre-programmed acceleration events and other control signals related to high acceleration events and provide those events to said processor.

8. A MEMS device according to claim 7 wherein said at least one sensor input, said processor, and said memory are located within an inertial measurement unit.

9. A MEMS device according to claim 7 wherein said device comprises at least one of a tuning fork gyroscope, an angular rate sensing gyroscope, an accelerometer, an inertial measurement unit, a resonator, a pressure sensor, and a temperature sensor.

10. A control circuit for reducing or eliminating stick-down within a micro-electromechanical systems (MEMS) device, said control circuit comprising a processor configured to control sense bias voltages applied to the sense plates based upon acceleration forces applied to the MEMS device.

11. A control circuit according to claim 10 wherein said control circuit further comprises:

at least one acceleration sensor input; and a memory configured to store pre-programmed acceleration events and provide those events to said processor, said processor configured to adjust sense bias voltages based upon said at least one acceleration sensor input and pre-programmed acceleration events stored in said memory.

12. A method for suppressing stick-down of proof masses to sense plates in micro-electromechanical systems (MEMS) devices, said method comprising adjusting a sense bias voltage applied to the sense plates based upon acceleration forces applied to the MEMS device.

13. A method according to claim 12 wherein adjusting a sense bias voltage applied comprises controlling the sense bias voltage with a processor, based upon acceleration sensor inputs received by the processor.

14. A method according to claim 12 wherein adjusting a sense bias voltage applied comprises controlling the sense bias voltage with a processor, based upon pre-programmed acceleration events stored in a memory which is accessed by the processor.

15. A method according to claim 12 further comprising:

determining an end to an applied acceleration force; and returning the sense bias voltage applied to the sense plates to voltage applied before the acceleration forces were applied.

16. A micro-electromechanical systems (MEMS) gyroscope comprising:

a substrate;

a plurality of sense plates attached to said substrate;

a plurality of motor drive combs attached to said substrate;

a plurality of motor pickoff combs attached to said substrate;

a plurality of proof masses, each said proof mass suspended above a respective one of said sense plates and between a respective one of said motor drive combs and a respective one of said motor pickoff combs; and a control circuit configured to reduce stick-down between said proof masses and said sense plates, said circuit configured to adjust a sense bias voltage applied to said sense plates based upon an amount of acceleration applied to said MEMS device.

17. A MEMS gyroscope according to claim 16 wherein said control circuit comprises:

at least one acceleration sensor input;

a processor configured to adjust the sense bias voltage based upon said at least one acceleration sensor input and pre-programmed acceleration events; and a memory configured to store the pre-programmed acceleration events and provide those events to said processor.

* * * * *

UNITED STATES PATENT AND TRADEMARK OFFICE
CERTIFICATE OF CORRECTION

PATENT NO. : 6,718,825 B1
APPLICATION NO. : 10/346335
DATED : April 13, 2004
INVENTOR(S) : Platt et al.

It is certified that error appears in the above-identified patent and that said Letters Patent is hereby corrected as shown below:

In Background of Invention, column 1, line 28, after “gyroscopes” delete “MEMS gyroscopes”.

In Drawings

In Figure 2, after “Proof Mass 15” delete “MOTOR DRIVE COMB 18” and insert therefor -- MOTOR DRIVE COMB 19 --.

Signed and Sealed this

Twenty-fifth Day of July, 2006

JON W. DUDAS

*Director of the United States Patent and Trademark Office*